United States Patent [19]

Okushima et al.

[11] Patent Number: 4,748,390
[45] Date of Patent: May 31, 1988

[54] CAPACITIVE-TYPE DETECTION DEVICE

[75] Inventors: Akihiro Okushima; Shinichi Shoji, both of Nagoya, Japan

[73] Assignee: Omron Tateisi Electronics Co., Kyoto, Japan

[21] Appl. No.: 777,432

[22] Filed: Sep. 18, 1985

[30] Foreign Application Priority Data

Sep. 19, 1984 [JP] Japan .................................. 59-196142
Sep. 21, 1984 [JP] Japan .................................. 59-199061
Sep. 21, 1984 [JP] Japan ........................... 59-143822[U]

[51] Int. Cl.$^4$ ................................................. B60S 1/08
[52] U.S. Cl. .................................... 318/483; 318/444; 15/250 C
[58] Field of Search ..................... 73/73; 318/444, 483; 200/61.05; 15/250 C; 331/65

[56] References Cited

U.S. PATENT DOCUMENTS

| | | | |
|---|---|---|---|
| 3,614,664 | 10/1971 | Shute | 333/110 |
| 3,649,898 | 3/1972 | Inoue | 318/483 |
| 3,826,979 | 7/1974 | Steinmann | 318/483 |
| 4,131,834 | 12/1978 | Blaszkowski | 318/483 |
| 4,347,741 | 9/1982 | Geiger | 331/65 |
| 4,428,232 | 1/1984 | Tanaka et al. | 331/65 |
| 4,499,410 | 2/1985 | Iacoponi et al. | 318/483 |
| 4,513,257 | 4/1985 | Miyamoto et al. | 331/65 |
| 4,527,105 | 7/1985 | Shiraishi | 318/444 |
| 4,554,493 | 11/1985 | Armstrong | 318/483 |
| 4,567,412 | 1/1986 | Graham | 15/250 C |
| 4,584,508 | 4/1986 | Kobayashi et al. | 318/444 |
| 4,589,771 | 5/1986 | Watanabe et al. | 15/250 C |
| 4,595,866 | 6/1986 | Fukatsu et al. | 318/483 |

FOREIGN PATENT DOCUMENTS 2057062 11/1970 Fed. Rep. of Germany .... 15/250 C
2345546 3/1975 Fed. Rep. of Germany ...... 318/483

*Primary Examiner*—William A. Cuchlinski, Jr.
*Assistant Examiner*—Thomas B. Will
*Attorney, Agent, or Firm*—Stevens, Davis, Miller & Mosher

[57] ABSTRACT

A detection device comprising a detection wall member for sensing a predetermined existence of an object adjacent to the device, detection electrode member including a detection electrode and a ground electrode which are disposed in the detection wall member, oscillation circuit member including a resonance circuit associated with a capacitance between the detection and ground electrodes, and detection circuit member for detecting change of oscillation of the oscillation circuit member by change of the capacitance between the electrodes so that the predetermined existence of the object adjacent to the detection wall member is detected by the device.

8 Claims, 8 Drawing Sheets

CAPACITIVE-TYPE DETECTION DEVICE

BRIEF SUMMARY OF THE INVENTION

This invention relates to a capacitive-type detection device for detecting an object or water adjacent to the device, and more particularly, to an improved capacitive-type detection device for detecting water on a windshield to control windshield wiper systems employed in vehicles, vessels or aircrafts.

Windshield wiper systems for automotive vehicles are conventionally set or reset with manual operations by drivers. When the windshield is wet and obscured by rain or a dense fog on driving the vehicle, the driver must actuate a manual wiper switch to start the windshield wiper system for wiping the wet windshield. The manual operation on the driving is, however, troublesome to the driver and unfavorable in view of safety driving.

It is, therefore, a primary object of this invention to provide a capacitive-type detection device for detecting a predetermined existence of an object or water adjacent to the device which may be applied to not only windshield wiper systems but also other universal control systems.

It is a further object of this invention to provide a capacitive-type detection device which may be coupled with a wind shield wiper system so that when the windshield is obscured by water or foreign matters, the wiper system automatically wipes the windshield without any manual operations.

It is a still further object of this invention to provide an improved detection device including detection electrodes and detection circuit for sensing the capacitive changes by water or foreign matters between the detection electrodes.

According to this invention, there is provided a detection device which includes a detection wall member for sensing a predetermined existence of an object adjacent to the device, a detection electrode member including a detection electrode and a ground electrode which are disposed in the detection wall member, oscillation circuit member including a resonance circuit associated with a capacitance between the detection and ground electrodes, and detection circuit member for detecting change of oscillation of the oscillation circuit member by change of the capacitance between the electrodes that the predetermined existence of the object, such as drops of water, a a water film or other liquid status, adjacent to the detection wall member be detected by the device.

BRIEF DESCRIPTION OF DRAWINGS

Further objects and advantages of this invention will become apparent from the following detailed description and the accompanying drawings in which.

DESCRIPTION OF THE PREFERRED EMBODIMENTS

Figure 1:
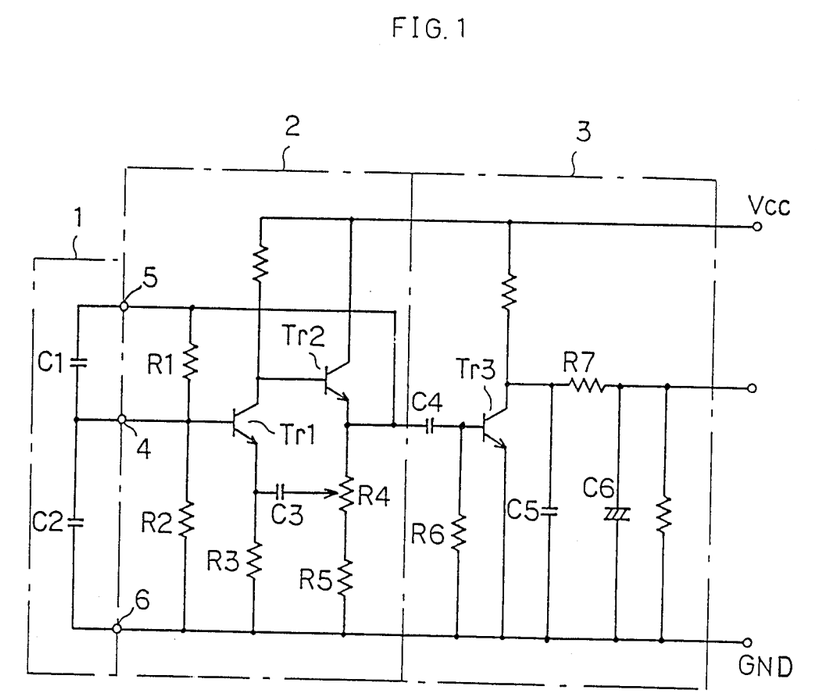
FIG. 1 is a circuit diagram of a detection device as a preferred first embodiment of this invention.
Figure 2:
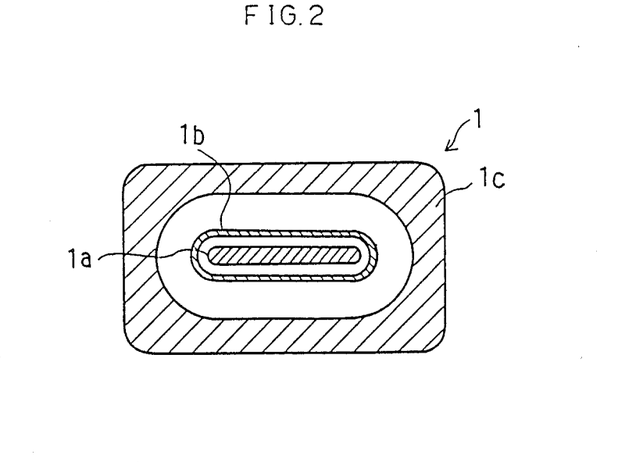
FIG. 2 is a schematic top plan view of the detection device of FIG. 1 with its housing removed.

Referring, now, to FIG. 1, there is shown a circuit diagram of a capacitive-type detection device as a first embodiment of this invention. The detection device includes a detection electrode member 1, an oscillation circuit 2 coupled with the electrode member 1 which oscillates at a frequency defined by a capacitance of the electrode member, and a detection circuit 3 for detecting an output signal from the oscillation circuit 2. The detection electrode member 1 includes an elongated oval-shaped electrode 1a, a ring-shaped sub-electrode 1b surrounding the electrode 1a, and a ground electrode 1c surrounding the electrode 1b at intervals of a predetermined distance therefrom, as illustrated in FIG. 2 which shows top surface of the detection device with its housing removed. The electrodes 1a, 1b and 1c are respectively connected to terminals 4, 5 and 6 of FIG. 1, and provides a detection area of the device. The capacitance C1 between electrodes 1a and 1b and the capacitance C2 between electrodes 1a and 1c are respectively applied to resistors R1 and R2 in parallel therewith. The oscillation circuit 2 includes transistors Tr1 and Tr2 which are connected in series to provide an amplifier where the resistor R1 is connected between the emitter of transistor Tr2 and the base of transistor Tr1 and the resistor R2 is connected between the base of the transistor Tr1 and ground. The emitter of the transistor Tr1 is grounded through resistor R3 and connected to a movable contact of a variable resistor R4 through a capacitor C3. The resistor R4 is disposed to vary its oscillation frequency, and serves together with resistor R5 as an emitter resistance of the transistor Tr2. Thus, a bridge circuit in constituted by resistor R1, capacitance C1 and resistor R2, capacitance C2, resistors R3 and R4, and capacitance C1, which defines the oscillation frequency. The output from the oscillation circuit 2 is applied to the detection circuit 3 where it is applied to transistor Tr3 through capacitor C4 and resistor R6. The detection circuit 3, which includes a smoothing circuit consisting of capacitors C5 and C6 and resistor R7, amplifies and detects the high frequency signal applied thereto from the oscillation circuit 2.

Figure 3:
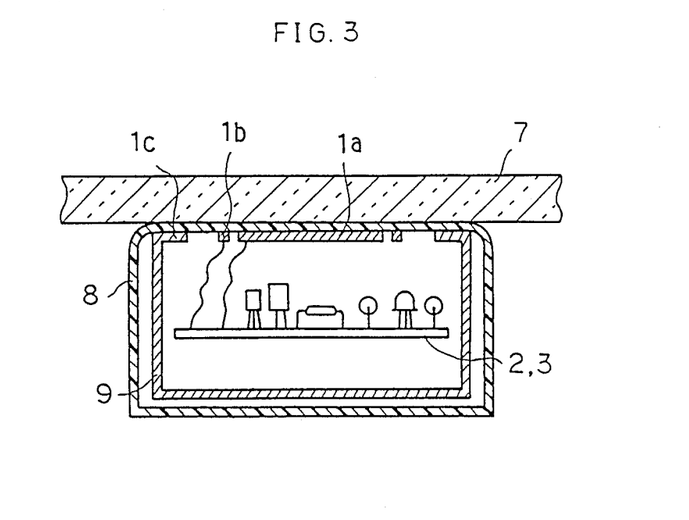
FIG. 3 is a schematic sectional side view of the device of FIG. 2 which is mounted on a glass windshield.

FIG. 3 shows a sectional side view illustrating an assembled construction of the detection device of this embodiment. The top surface of the device is mounted on an inner surface of glass plate 7 of a windshield, while an outer surface of the plate 7 is externally exposed to be wet with a drop of water or rain. The device is covered with a housing 8 made of synthetic resin. The detection electrode member 1 including electrodes 1a, 1b and 1c illustrated in FIG. 2 is mounted on an inner surface of a top wall or detection wall member of the housing 8. The ground electrode 1c is formed as a single unit together with a metal shielding cover 9 housing the oscillation and detection circuits within the housing 8. If desired, the electrode member 1 may be exposed on an external surface of the housing 8 or burried within the housing.

Figure 4:
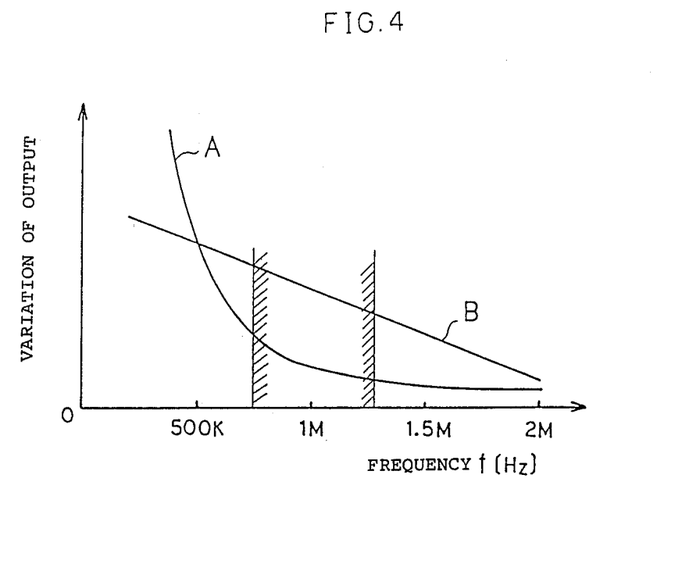
FIG. 4 illustrates changes of an output developed in the device relative to oscillation frequency.

FIG. 4 illustrates variations of the output voltage in the oscillation circuit 2 at various oscillation frequencies. When a water thin film uniformly adheres to the outer surface of the glass plate 7, the variation of the output voltage of the circuit 2 with respect to frequencies is represented by a curve A. When drops of water adhere to the glass plate 7, the variation of the output voltage with respect to frequencies is represented by a curve B. If this device is applied to a windshield wiper system for an automotive vehicle by utilizing this device as a drive signal for the windshield wiper system, the wiper system is not necessary to be actuated when a thin water film remains on the windshield after actuating the wiper system once or several times because such a thin water film is dried up in a short time period without substantially obscuring driver's view through the windshield. Accordingly, the detection device is not necessary to generate any detection signal in this case. When drops of water adhere to the windshield, however, the wiper system must be actuated immediately because such drops obscure the drive's view, viz. a detection signal must be generated from the device. It is, therefore, desirable that the variation of the output from the oscillation circuit 2 by such water film is small as far as possible and the variation by the drops of water is large. Accordingly, the oscillation circuit 2 is designed to have an oscillation frequency within a frequency band in which the variation (curve B) of the output voltage of the circuit 2 by the drops of water is larger than that (curve A) by the water film. In this embodiment, the circuit 2 is designed to oscillate at a frequency around 1 MHz within a band shown by partial hatching in FIG. 4 so as to be easy to only detect drops of water on the outer surface of the glass plate 7. By adjusting circuit constants of the bridge circuit of the oscillation circuit 2, the circuit 2 can oscillate at the best frequency (herein, 1 MHz) where the difference between the curves A and B is the largest.

Figure 5:
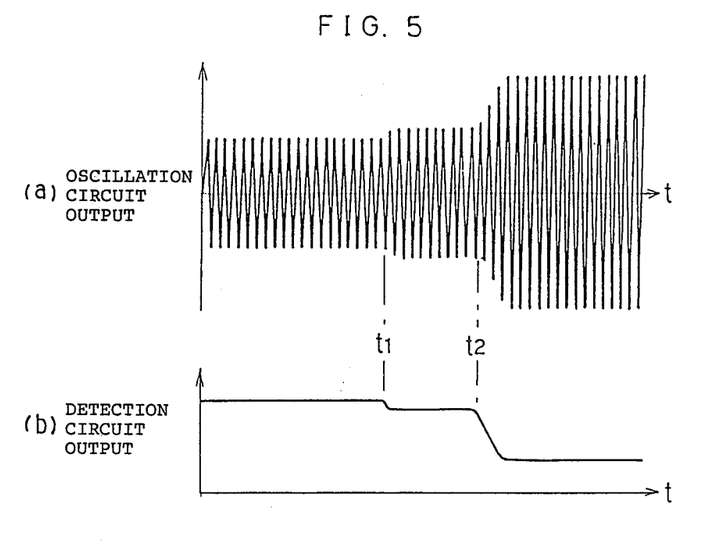
FIG. 5 is a graph illustrating wave forms in the circuit of FIG. 1.

As a power source is connected between terminals Vcc and GND of FIG. 1, the oscillation circuit 2 generates an a.c. output prior to a time point t1 as illustrated in FIG. 5(a) where the outside surface of the glass plate 7 (FIG. 3) is dry. When a water film adheres to the plate 7 at the time point t1, the amplitude of the a.c. output slightly varies. When drops of water adhere to the plate at a time point t2, the amplitude of the a.c. output greatly varies to a larger amplitude as illustrated in FIG. 5(a) and the collector voltage of the transistor Tr3 is reduced, so that the output from the detection circuit 3 is also reduced as illustrated in FIG. 5(b). Thus, the output from the detection circuit 3 represents whether or not there exist drops of water on the glass plate 7.

Figure 6:
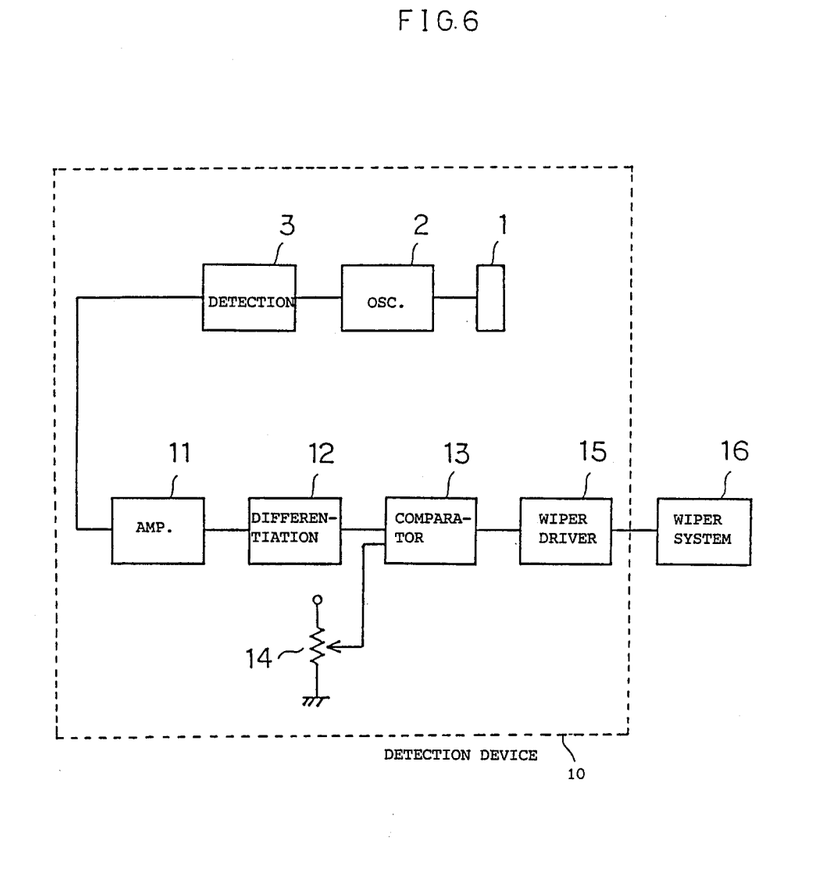
FIG. 6 is a schematic block diagram of a detection device coupled with windshield wiper driver as a second embodiment of this invention.

In FIG. 6, there is shown a detection device 10 connected to a windshield wiper system as a second embodiment of this invention. The device 10 includes detection electrode member 1, oscillation circuit 2 coupled with the member 1, and detection circuit 3 associated with the circuit 2. The respective member 1, circuit 2 and circuit 3 are constructed with the same components as those of the above-mentioned first embodiment. The detection device 10 further includes an inverted amplifier 11 for amplifying the outputs from the detection circuit 3, a differentiation circuit 12, a comparator 13, a reference level source 14 and a wiper driver 15. The differentiation circuit 12 is disposed to avoid the changes of the oscillation amplitude by temperature changes applied to the circuits 2 and 3 and the amplifier 11 in long time use or by gradually obscuring the glass plate 7 with stain or dirt in long time period, so that it applies only a rapid change of the oscillation amplitude by the adhesion of water drops to the comparator 13. The comparator 13 is applied by a reference level voltage from the reference level source 14 to generate a detection signal when the output from the circuit 12 exceeds the reference level voltage, the detection signal being applied to the wiper driver 15 which drives a wiper system 16 by supplying a drive signal thereto.

Figure 7:
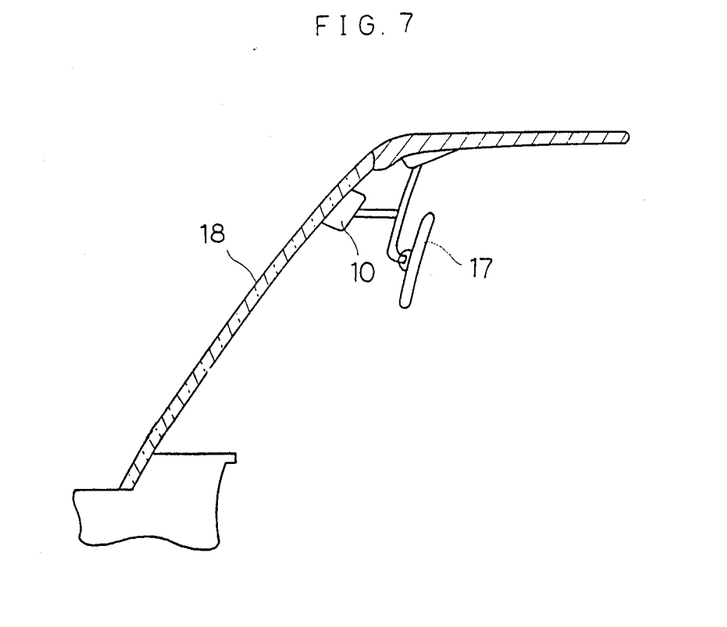
FIGS. 7 and 8 illustrate the detection device of FIG. 6 mounted on a windshield of an automotive vehicle.
Figure 8:
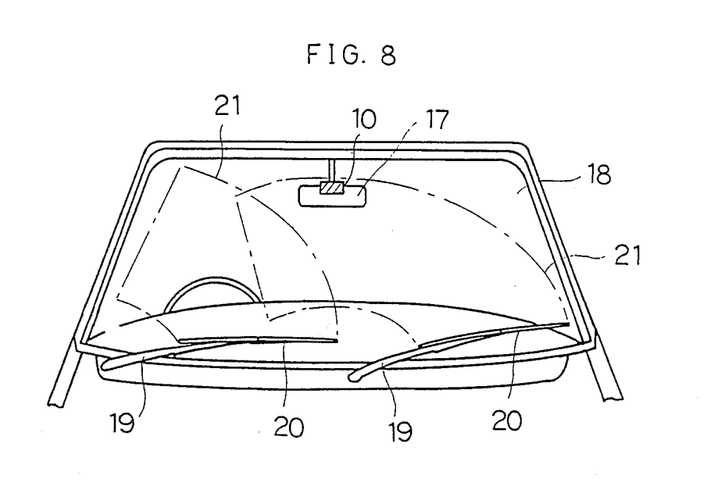

The detection device 10 may be installed onto a predetermined position of a windshield 18 of a vehicle, behind a rearview mirror 17 as shown in FIG. 7. The device 10 is mounted on an inner surface of the windshield glass plate 18 so as to be hidden by the mirror 17 within the view of the driver. FIG. 8 shows a front view of the vehicle installed by the device 10. The wiper system 16 includes arms 19 and rubber blades 20 contacting the glass plate 18. The blades 20 are driven through the arms 19 by a motor within the wiper system 16 which is adapted to be actuated by outputs from the wiper driver 15, and performs wiping fan-shaped area 21 of the windshield 18 on the reverse-side surface which the device 10 at its detection surface is mounted.

Figure 9:
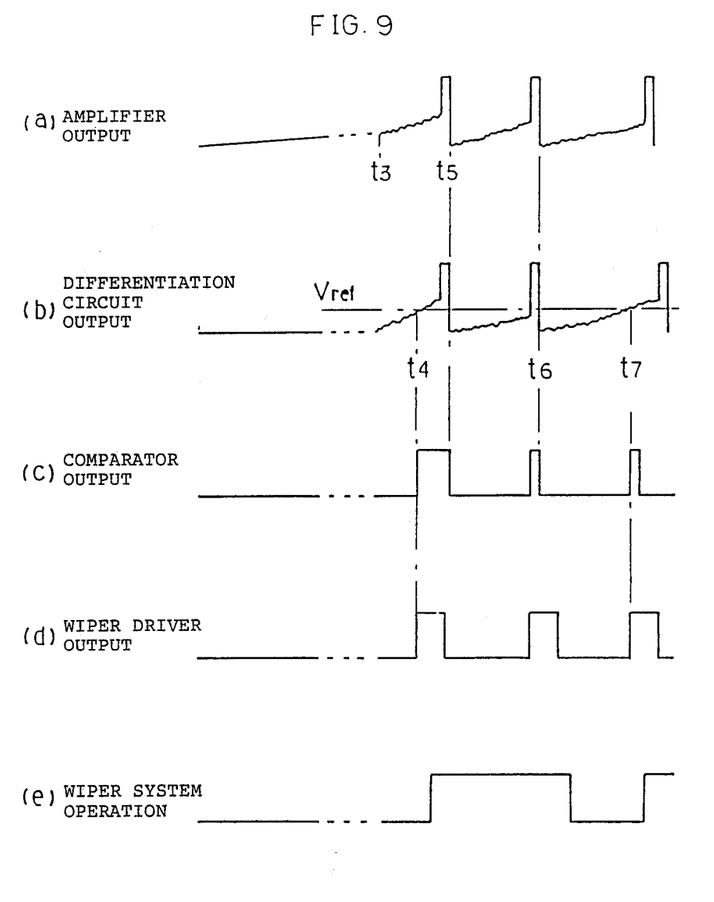
FIG. 9 shows wave forms developed in the block diagram of FIG. 6.

Referring to FIG. 9 the operations by the device of FIG. 6 will be explained hereinafter. The circuit constants of the bridge circuit of the oscillation circuit 2 is designed to oscillate the circuit 2 at a frequency, e.g. 1 MHz, where the difference between the curves A and B in FIG. 4 is the largest as explained in the foregoing first embodiment. As the device 10 is supplied with power from a battery or power source, the oscillation circuit 2 oscillates at 1 MHz. The oscillation frequency is set to the frequency at which the amplitude of the oscillation little varies by a water film on the windshield 18, so that the water film on the windshield 18 little changes the amplitude. As shown in FIG. 9(a) the output from the inverted amplifier 11 slowly increases by temperature changes or the like through long time operations, but the output level of the differentiation circuit 12 becomes constant or is corrected as illustrated in FIG. 9(b).

As at a time point t3 it starts raining and drops of water adhere to the windshield 18, the output from the oscillation circuit 2 is reduced and the output from the inverted amplifier 11 gradually increases as shown in FIG. 9(a). Then, the differentiation circuit 12 supplied the comparator 13 with the change of the output of the amplifier 11 as shown in FIG. 9(b). At a time point t4 when the input applied to the comparator 13 reaches the reference level Vref from the source 14, the comparator 13 applies its output shown in FIG. 9(c) to the wiper driver 15. As shown in FIG. 9(d), the wiper driver 15 drives the wiper system 16 in response to the rising of the output signal from the comparator 13 for a predetermined time period. Successively the wiper system 16 starts the wiping operation shown in FIG. 9(e). When one of the blades 20 comes into the detection device 10 at its detection electrode member 1 with wiping water drops on the windshield 18 from its original position in a forward direction, the amplifier 11 generates a peak signal at time point t5 due to the wiped water by the blade. If the blades 20 pass the device 10, the water drops adjacent to the device 10 are wiped away, so that the output from the amplifier 11 is rapidly reduced just after the time point t5. If it successively rains, however, the output from the amplifier 11 again increases after the time point t5 and when the output from the circuit 12 reaches the reference level Vref or the blade 20 again comes to the device 10 in a returning direction, the comparator 13 generates a second output signal prior to a time point t6 as illustrated in FIG. 9(c). In response to the second output from the comparator 13, the driver 15 produces a second output pulse during the time when the blades 20 are still moving to their original position, so that it does not change the wiping operation as illustrated in FIG. 9 e). If it still rains after the above-mentioned one wiping cycle, the output from the amplifier 11 again increases and when the output from the circuit 12 reaches the reference level Vref at a time point t7, the wiper driver 15 allows the wiper system 16 to restart. Thus, these operations will repeat as long as it rains. Since the time period from t4 to t7 continuously varies with the volume of the drops of water, every wiping cycle can be continuosly changed according to the volume of rainfall. If it rains harder, the cycle of the output from the driver 15 becomes shorter and the rest period of the blades 20 also becomes shorter. As the volume of rainfall decreases, the rest period of the blades 20, viz. stopping period of the wiper system 16, becomes longer. Thus, the wiper system of this embodiment automatically starts when it start raining, automatically quickens its wiping cycles as it rains harder, and automatically stops when it stops raining.

The device 10 is mounted on an upper portion of the windshield 18, whereby snow adhering to the windshield from the front hood by blowing when the vehicle runs faster than a predetermined speed is sensed by the device 10 to drive the wiper system 16.

Figure 10:
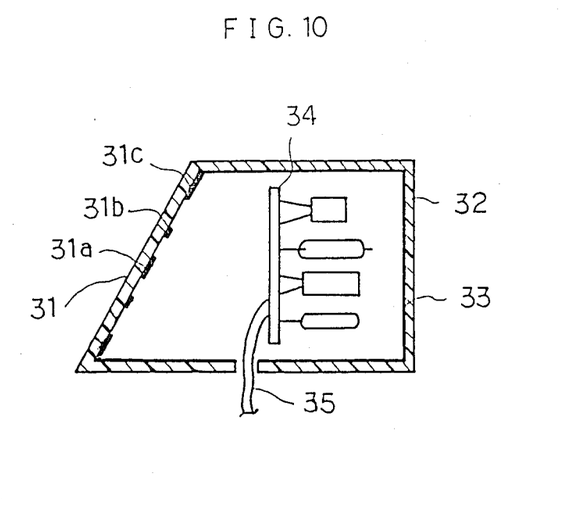
FIG. 10 is a schematic sectional side view of a detection device as a third embodiment of this invention.

Returning to FIG. 10, there is shown a side sectional view of a detection device as a third embodiment of this invention. As illustrated in the foregoing embodiments, the device includes at its front surface a detection surface 31 and is housed within a housing 32. On an inner surface of the housing 32 opposing to the detection surface 31, there are mounted a detection electrode 31a, a ring-shaped sub-electrode 31b surrounding the electrode 31a, and a ground terminal 31c at intervals of a predetermined distance from the electrode 31b in the same construction as that of FIG. 2. The detection surface 31 is formed at a slant angle along an angle of a windshield. The housing 32 is made of synthetic resin, and at its inner wall surfaces provided with a shield film 33 electrically connected with the ground electrode 31c covering inner circuitry within the housing 32. The inner circuitry is assembled on a printed-circuit-board 34 and a connecting cable 35 therefrom extends downwardly.

Figure 11:
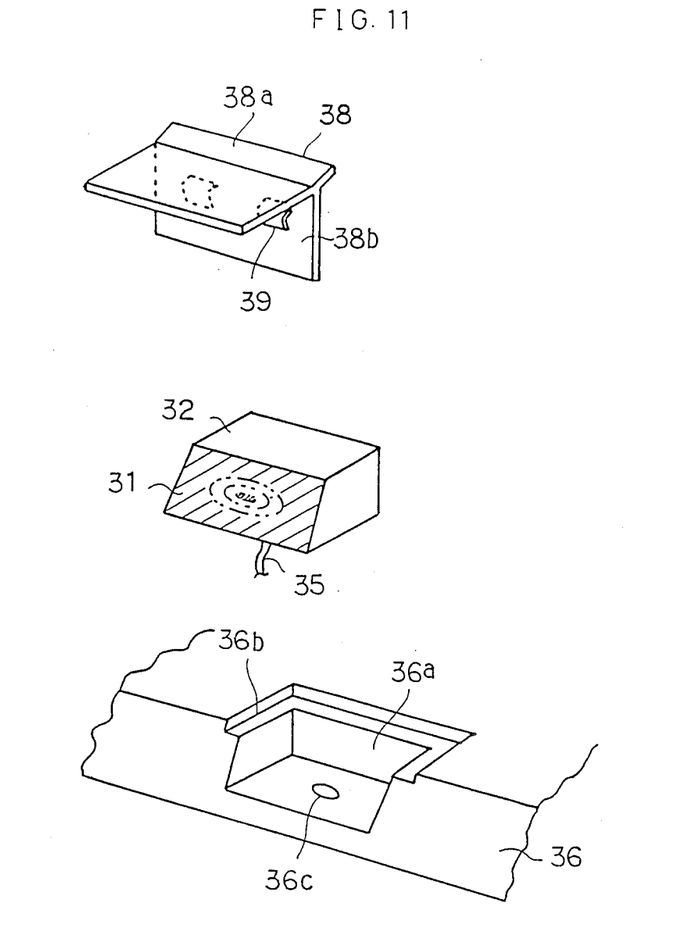
FIG. 11 illustrates the device of FIG. 10 and a mounting member for a vehicle.
Figure 12:
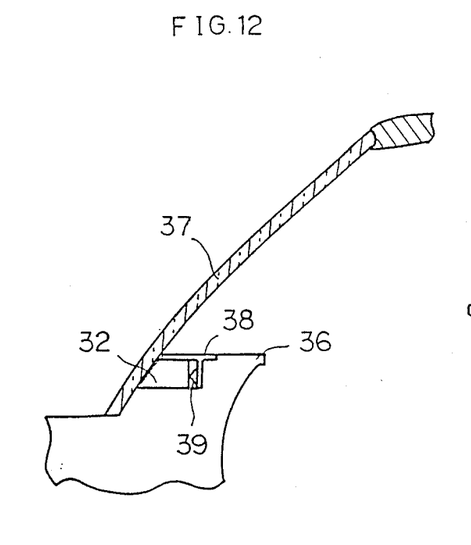
FIG. 12 is partial sectional view illustrating the device of FIG. 10 mounted on a windshield of the vehicle.
Figure 13:
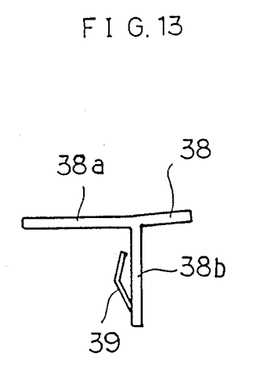
FIG. 13 is a side view of the mounting member.

FIG. 11 illustrates assembling components to mount the device into a front portion of a dash board 36 as illustrated in FIG. 12. The board 36 at its front portion includes a recessed portion 36a fitting the housing 32. As the components of FIG. 11 are assembled, the cable 35 extends through a hole 36c, and a cover 38 including a lip portion 38a and a wall 38b fits a step 36b of the board 36 with pushing the housing 32 toward the windshield 37 by a leaf spring 39 supported on wall 38b of cover 38 as shown in FIG. 13 whereby the detection surface 31 is fitted to the windshield 37 at an area to be wiped by blades of its wiper system. The device of this embodiment is completely hidden within the dash board, so that ornamental design is improved without hindering driver's view. FIG. 13 is a side view of cover 38 and spring 39.

In the foregoing embodiments, the detection device includes detection sub-electrode to provide a pair of capacitors in the electrodes and perform temperature compensation for oscillation frequency by employing the bridge circuit as the resonance circuit. If desired, however, the sub-electrode may be omitted to simplify the construction of the device.

The detection device of the above embodiments may be applied to rear window wiper systems of vehicles, and other windshield wiper systems of vehicles or aircrafts. The detection device may be modified to detect not only water but also other materials, such as oil, dust or the like, by selecting the best oscillation frequency. The detection device may be further applied to other sensor systems which sense any materials adhering to its sensing surface.

The above description is of preferred embodiments of this invention and many modifications may be made thereto without departing from the spirit and scope of this invention.

What is claimed is:

1. A detection device mounted on a windshield to detect water adhering to an external surface of the windshield to be wiped by a windshield wiping system, comprising:

detection electrode means including a detection electrode and a ground electrode which are mounted adjacent said windshield, oscillation circuit means including a resonance circuit associated with a capacitance between said detection electrode and said ground electrode, said oscillation circuit means changing its oscillation frequency in response to change in said capacitance caused by a presence of water on said external surface of the windshield adjacent said detection electrode means, said water causing said capacitance to vary in accordance with whether it is in the form of drops of water or a film of water, said oscillation circuit means including means for changing the oscillation frequency thereof by a larger amount in response to the presence of drops of water adjacent said detection electrode means and by a lesser amount in response to the presence of a film of water adjacent said detection electrode means, and detection circuit means for detecting a change of oscillation frequency of said oscillation circuit means and determining whether said change of oscillation frequency in said larger amount indicating the presence of drops of water adjacent said detection electrode means or said lesser amount indicating the presence of a film of water adjacent said detection electrode means, whereby said detection device drives said windshield wiping system in a first mode if said detection circuit means detects said larger amount of change in oscillation frequency and in a second mode if said detection circuit means detects said lesser amount of change in oscillation frequency.

2. A detection device according to claim 1 wherein said detection circuit means includes a comparator comparing an oscillation amplitude of said oscillation circuit means with a predetermined reference level so as to detect the existence of the drops of water adjacent to the detection electrode means.

3. A detection device according to claim 1, further comprising wiper driving means, responsive to said detection circuit means, for generating a signal to drive said windshield wiper system for wiping water adjacent to said detection electrode means.

4. A detection device according to claim 3 wherein said wiper driving means generates said signal in a cycle varying according to volume of water after wiping by said windshield wiper system.

5. A detection device according to claim 1 wherein said device is mounted behind a rearview mirror of an automobile.

6. A detection device according to claim 1 wherein said device is mounted in a dash board of an automobile.

7. A detection device mounted on a windshield to detect water adhering to an external surface of the windshield to be wiped by a windshield wiping system, comprising:
   detection electrode means including a detection electrode and a ground electrode which are mounted adjacent said windshield,
   ocillation circuit means including a resonance circuit associated with a capacitance between said detection electrode and said ground electrode, said oscillation cirucit means changing its oscillation frequency in response to change in said capacitance caused by a presence of water on said external surface of the windshield adjacent said detection electrode means, said water causing said capacitance to vary in accordance with whether it is in the form of drops of water or a film of water, said oscillation circuit means including means for changing the oscillation frequency thereof by a larger amount in response to the presence of drops of water adjacent said detection electrode means and by a lesser amount in response to the presence of a film of water adjacent said detection electrode means, and
   detection circuit means for detecting a change of oscillation frequency of said oscillation circuit means and determining whether said change of oscillation frequency is said larger amount indicating the presence of drops of water adjacent said detection electrode means or said lesser amount indicating the pressure of a film of water adjacent said detection electrode means, whereby said detection device drives said windshield wiping system in a first mode if said detection circuit means detects said larger amount of change in oscillation frequency and in a second mode if said detection circuit means detects said lesser amount of change in oscillation frequency,
   wherein said detection electrode means further includes a detection sub-electrode between said detection and ground electrodes, and
   wherein said oscillation circuit means oscillates at a resonance frequency of a bridge circuit including a capacitance between said detection electrode and said detection sub-electrode and the capacitance between said detection electrode and said ground electrode.

8. A detection device mounted on a windshield to detect water adhering to an external surface of the windshield to be wiped by a windshield wiping system, comprising:
   housing means including a detection wall member mounted on an inner surface of said windshield,
   detection electrode means disposed in said housing means and including a detection electrode and a ground electrode which are disposed on said detection wall member mounted adjacent said windshield,
   oscillation circuit means disposed in said housing means and including a resonance circuit associated with a capacitance between said detection electrode and said ground electrode, said oscillation circuit means changing its oscillation frequency in response to change in said capacitance caused by a presence of water on said external surface of the windshield adjacent said detection electrode means, said water causing said capacitance to vary in accordance with whether it is in the form of drops of water or a film of water, said oscillation circuit means including means for changing the oscillation frequency thereof by a larger amount in response to the presence of drops of water adjacent said detection electrode means and by a lesser amount in response to the presence of a film of water adjacent said detection electrode means, and
   detection circuit means disposed in said housing means, for detecting a change of oscillation frequency of said oscillation circuit means and determining whether said change of oscillation frequency is said larger amount indicating the presence of drops of water adjacent said detection electrode means or said lesser amount indicating the presence of a film of water adjacent said detection electrode means, whereby said detection device drives said windshield wiping system in a first mode if said detection circuit means detects said larger amount of change in oscillation frequency and in a second mode if said detection circuit means detects said lesser amount of change in oscillation frequency.

* * * * *